United States Patent [19]

Parkin et al.

[11] Patent Number: 5,014,147
[45] Date of Patent: May 7, 1991

[54] MAGNETORESISTIVE SENSOR WITH IMPROVED ANTIFERROMAGNETIC FILM

[75] Inventors: Stuart S. P. Parkin; Kevin P. Roche; Virgil S. Speriosu, all of San Jose, Calif.

[73] Assignee: International Business Machines Corporation, Armonk, N.Y.

[21] Appl. No.: 429,678

[22] Filed: Oct. 31, 1989

[51] Int. Cl.⁵ ............................ G11B 5/39; G11B 5/30
[52] U.S. Cl. .................................................. 360/113
[58] Field of Search ........................... 360/113; 6/110; 338/32 R; 324/252

[56] References Cited

U.S. PATENT DOCUMENTS

| | | | |
|---|---|---|---|
| 3,582,912 | 6/1971 | LeRoi et al. | 340/174 |
| 4,103,315 | 7/1978 | Hempstead et al. | 360/110 |
| 4,663,685 | 5/1987 | Tsang | 360/113 |
| 4,755,897 | 7/1988 | Howard | 360/113 |
| 4,782,413 | 11/1988 | Howard et al. | 360/113 |

Primary Examiner—David J. Severin
Attorney, Agent, or Firm—Otto Schmid, Jr.

[57] ABSTRACT

An improved thin film magnetoresistive (MR) sensor uses an alloy comprising $Fe_{(1-x)}Mn_x$, where x is within the range of 0.3 to 0.4, as an antiferromagnetic layer to provide longitudinal exchange bias in the ferromagnetic MR layer. In a specific embodiment the exchange bias is at a high level and is independent of thickness of the antiferromagnetic layer over a wide range.

15 Claims, 4 Drawing Sheets

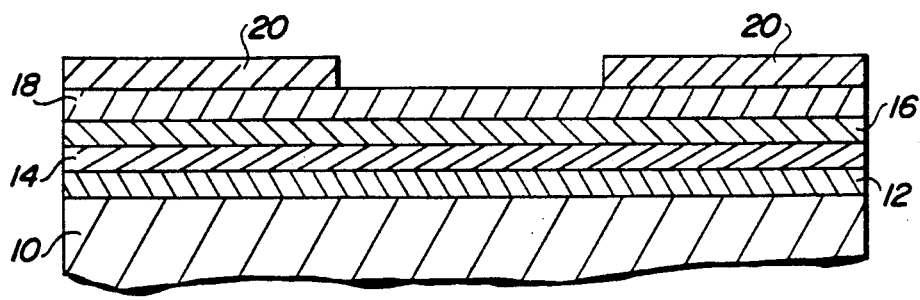
FIG.1
(PRIOR ART)
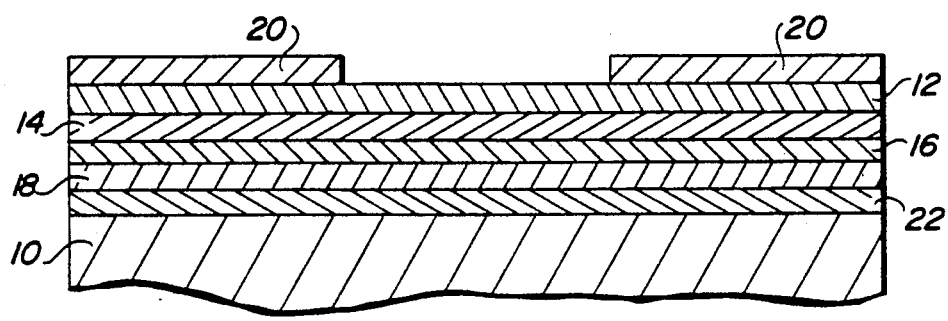
FIG.2
(PRIOR ART)
FIG.3
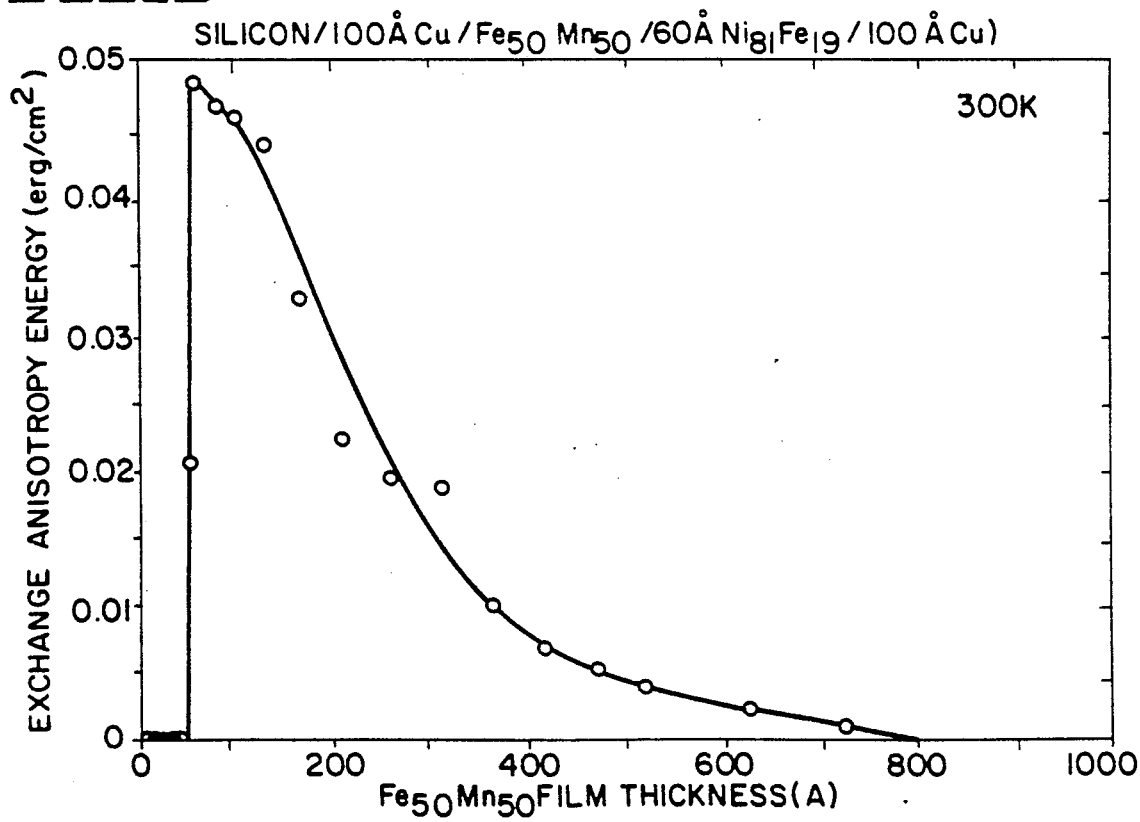

MAGNETORESISTIVE SENSOR WITH IMPROVED ANTIFERROMAGNETIC FILM

BACKGROUND OF THE INVENTION

This invention relates to magnetoresistive (MR) read sensors, and in particular to an MR read sensor in which an improved antiferromagnetic film provides a longitudinal bias field in the ferromagnetic MR film of the sensor.

DESCRIPTION OF THE PRIOR ART

The prior art discloses a magnetic transducer referred to as a magnetoresistive (MR) sensor or head which has been shown to be capable of reading data from a magnetic surface at great linear densities. An MR sensor detects magnetic field signals through the resistance changes of a read element made from a magnetoresistive material as a function of the amount and direction of magnetic flux being sensed by the MR element.

The prior art also teaches that in order for an MR element to operate optimally, two bias fields should be provided. In order to bias the material so that its response to a flux field is linear, a transverse bias field is generally provided. This bias field is normal to the plane of the magnetic media and parallel to the surface of the planar MR element.

The other bias field which is usually employed with MR elements is referred to in the art as the longitudinal bias field which extends parallel to the surface of the magnetic media and parallel to the lengthwise direction of the MR element. The function of the longitudinal bias field is to suppress Barkhausen noise which originates from multi-domain activities in the MR element.

Commonly assigned U.S. Pat. No. 4,103,315 to Hempstead et al. discloses the use of antiferromagnetic-ferromagnetic exchange coupling to produce a uniform longitudinal bias in the MR layer of the sensor.

Commonly assigned U.S. Pat. No. 4,663,685 describes an FeMn antiferromagnetic layer which is divided into separate end portions for providing an exchange bias primarily in the adjacent end portions of the MR layer. The exchange coupling between the antiferromagnetic and ferromagnetic layers creates a single domain state in the ferromagnetic layer and thereby suppresses the so-called Barkhausen noise associated with domain activity. For this reason, it is desirable to maximize the exchange bias effect in the MR layer.

The preferred materials suggested by U.S. Pat. No. 4,103,315 are nickel-iron ($Ni_{80}Fe_{20}$) as the ferromagnetic MR layer and a face-centered-cubic (FCC) phase (gamma phase) of a manganese (Mn) alloy as the antiferromagnetic layer. Of the possible gamma Mn alloys, iron-manganese ($Fe_{50}Mn_{50}$) appears to exhibit the greatest ability to exchange couple with the NiFe layer.

U.S. Pat. No 3,582,912 describes a magnetic structure having at least one layer of ferromagnetic material and at least one layer of an antiferromagnetic material. An iron-nickel-manganese alloy is suggested as an antiferromagnetic material, but no disclosure of the relative amounts of the components of the antiferromagnetic material is included.

One of the problems with the use of $Fe_{50}Mn_{50}$ as an antiferromagnetic layer is the relatively narrow window for production of the desired exchange bias. As recording density is increased, the production window will become progressively smaller. The narrow window for production of the desired exchange bias is caused by a phase instability of the $Mn_{50}Fe_{50}$ layer with increasing thickness. For thicknesses greater than some critical thickness of the order of 100 to 150 angstroms, the $Mn_{50}Fe_{50}$ layer transforms from the desired magnetic gamma phase to the non-magnetic (at room temperature) alpha phase. Therefore, there is a maximum possible layer thickness of the magnetic $Mn_{50}Fe_{50}$ phase and for this reason the fabrication process is difficult. In addition, exchange bias can be obtained only when the layers are deposited in a prescribed order.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 1 is an end view of a prior art magnetoresistive (MR) sensor.

FIG. 2 is an end view of an alternate embodiment of a prior art MR sensor.

FIG. 3 is a graph of exchange anisotropy energy as a function of the thickness of the antiferromagnetic layer for the MR sensors of FIGS. 1 and 2.

SUMMARY OF THE INVENTION

Figure 4:
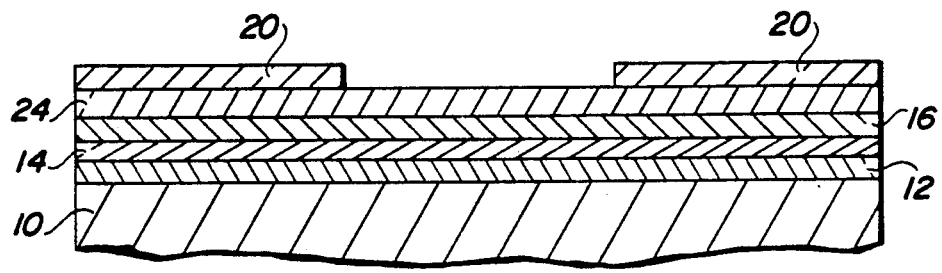
FIG. 4 is an end view of a specific embodiment of an MR sensor according to the present invention.

The invention is an improved magnetoresistive (MR) sensor wherein the antiferromagnetic layer formed in direct contact with the MR layer is an alloy of manganese (Mn) and iron (Fe), $Fe_{(1-x)}Mn_x$, where x is within the range of 0.3 to 0.4. The improved antiferromagnetic layer composition produces a comparable level of exchange bias, and the exchange bias is independent of thickness of the antiferromagnetic layer over a wide range in a specific embodiment.

The specific embodiment in which the level of exchange bias is independent of thickness of the antiferromagnetic layer over a wide range comprises a structure in which the antiferromagnetic layer is produced on a face-centered cubic (FCC) structure. In one embodiment, the FCC structure comprises the nickel-iron alloy of the MR layer, and, in a second embodiment, the FCC structure is provided by an auxiliary layer comprising copper or palladium.

In a further embodiment in which the antiferromagnetic layer is produced on a surface which is not an FCC structure, the level of exchange bias and the degree of thickness sensitivity of the antiferromagnetic layer are comparable to prior art structures which were deposited on a surface having an FCC structure.

While the invention has been particularly shown and described with reference to a preferred embodiment thereof, it will be understood by those skilled in the art that various other changes in the form and details may be made therein without departing from the spirit and scope of the invention.

DESCRIPTION OF THE PREFERRED EMBODIMENT

As shown in FIG. 1, a typical thin film magnetoresistive (MR) sensor comprises a substrate 10, a transverse bias layer 12, a non-magnetic spacer layer 14, an MR layer 16 and an antiferromagnetic layer 18. The MR layer 16, which is formed of a ferromagnetic material such as $Ni_{80}Fe_{20}$, is attached to electrical conductors 20 and provides an output current. The output current from MR layer 16 is a signal which enables a separate sensing circuit to determine resistance changes in the MR layer. The resistance changes are a function of the magnetic fields intercepted by MR layer 16 from the recorded data on the magnetic storage medium.

The transverse bias layer 12 provides a magnetic field oriented generally perpendicular to the medium so as to bias the magnetic field in MR layer 16 in a direction non-parallel to the medium. This transverse bias maintains the MR layer in a linear response mode so that the current output is essentially a linear function of the resistance changes. As is known in the art, the transverse bias can be provided by shunt biasing, soft film biasing, or permanent magnet biasing.

In order to insure that the MR layer has unidirectional anisotropy, an antiferromagnetic layer is formed in direct atomic contact with MR layer 16. The antiferromagnetic layer, which in the prior art may be the gamma phase of Mn alloys, creates an interface exchange coupling with the ferromagnetic MR layer 16. This results in a longitudinal exchange bias field in MR layer 16 and creates a single domain state in MR layer 16. The existence of a single magnetic domain state in MR layer 16 is essential to suppress Barkhausen noise which is associated with MR materials which exhibit multiple magnetic domain states.

A more comprehensive description of the use of antiferromagnetic-ferromagnetic exchange coupling to produce a uniform longitudinal bias in the MR layer 16 of the sensor is included in the previously mentioned U.S. Pat. No. 4,103,315. This patent states that, to obtain the exchange coupling, the antiferromagnetic material, the preferred material for which is $Fe_{50}Mn_{50}$, must be deposited onto a surface with face-centered cubic (FCC) structure, and $Ni_{80}Fe_{20}$ is the specific FCC structure described. This is basically the structure shown in FIG. 1 for which, for certain processing conditions, it is found that the exchange bias field reaches a peak at a thickness of $Fe_{50}Mn_{50}$ of about 100 angstroms and decreases with increasing thickness. This decrease is believed to be caused by a transformation from the desired magnetic gamma phase to the non-magnetic alpha phase for thicknesses greater than the critical thickness.

An alternate prior art embodiment is shown in FIG. 2, in which an FCC structure is provided by an auxiliary layer 22 such as copper or palladium. The inclusion of auxiliary layer 22 permits the antiferromagnetic layer 18 to be deposited prior to the MR layer 16 since the proper FCC structure is provided by the auxiliary layer 22, which in a specific embodiment is copper. In this embodiment, the spacer layer 14 and transverse bias layer 12 are deposited after the MR layer 16. The '315 patent teaches that, in the absence of an FCC structure upon which to deposit the antiferromagnetic layer 18, then no exchange coupling results. Independent of processing conditions, the bias field exhibited by the structure shown in FIG. 2 peaks at a thickness of $Fe_{50}Mn_{50}$ of about 100 angstroms and rapidly decreases with increasing thickness related to the structural transformation of the $Fe_{50}Mn_{50}$ layer. The exchange anisotropy energy is shown in FIG. 3 as a function of $Fe_{50}Mn_{50}$ thickness. The exchange anisotropy energy is related to exchange bias by a constant factor for a specific embodiment.

In order to provide an improved antiferromagnetic layer in the MR sensor, various $Fe_{(1-x)}Mn_x$ alloys were prepared as thin film structures by sputter deposition in a uniform magnetic field. The substrates were glass, silicon or sapphire. The various configuration of the specific structures will be discussed in detail later, but it was determined that antiferromagnetic layers of $Fe_{60}Mn_{40}$ produced results superior to that of the prior art $Fe_{50}Mn_{50}$ structures. The same was true for structures up to an iron content of 70% in the FeMn layer, but at this composition there was a tendency for the precipitation of alpha iron for layers beyond some critical thickness of the order of 200 angstroms. Based on the characteristics of these structures, it was concluded that vastly improved results can be obtained by the use of an antiferromagnetic layer of $Fe_{(1-x)}Mn_x$ where x is within the range of 0.3 to 0.4.

Figure 5:
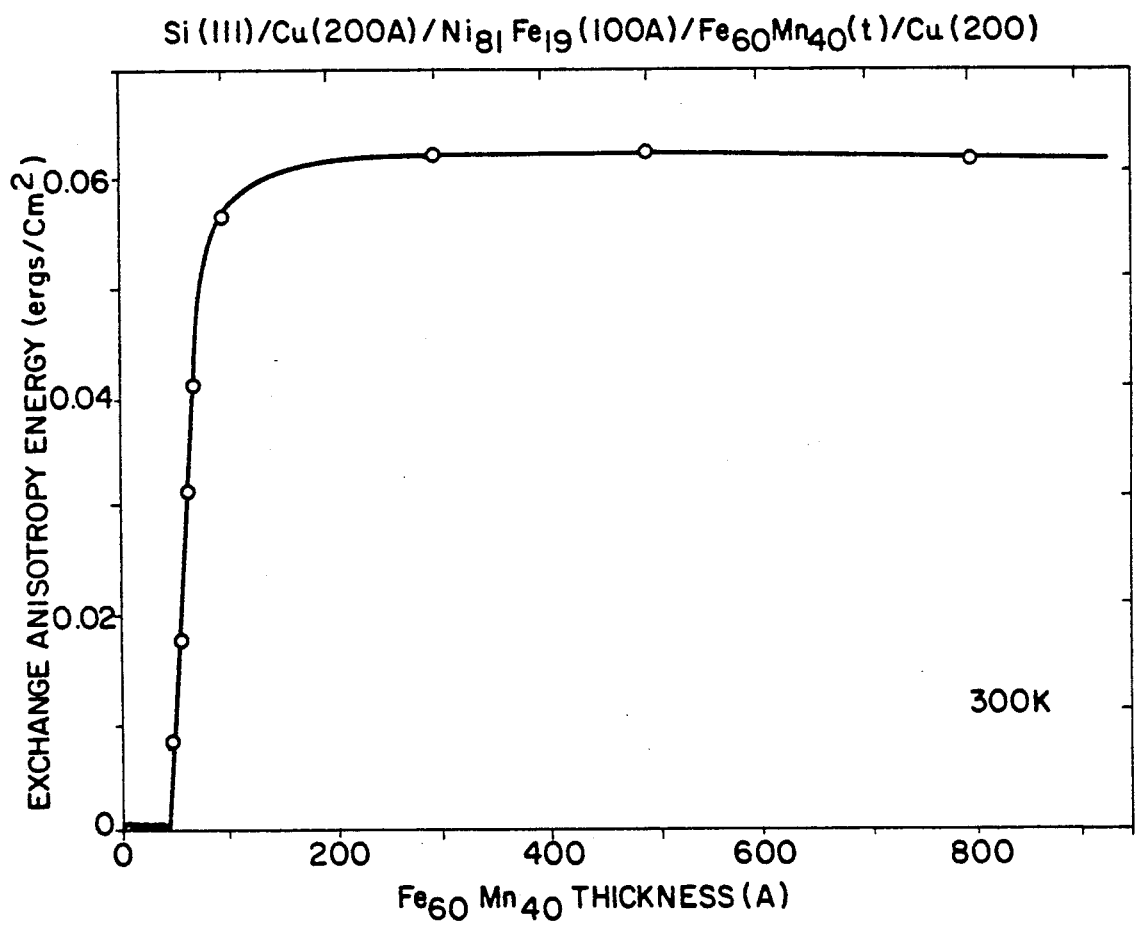
FIG. 5 is a graph of exchange anisotropy energy as a function of thickness of the antiferromagnetic layer for the MR sensor of FIG. 4.

A specific embodiment of an MR sensor, according to the present invention, is shown in FIG. 4. The MR sensor comprises a transverse bias layer 12, deposited on a suitable substrate 10, followed by a non-magnetic spacer layer 14 which separates transverse bias layer 12 from MR layer 16. An antiferromagnetic layer 24 is deposited in direct atomic contact with MR layer 16, and the composition of antiferromagnetic layer 24 is $Fe_{(1-x)}Mn_x$, where x is within the range of 0.3 to 0.4. The resulting exchange anisotropy energy for a specific embodiment is shown in FIG. 5. FIG. 5 shows that the exchange anisotropy energy and the related exchange bias increases rapidly until a high value is reached at a thickness of about 100 angstroms, and the exchange bias remains at the high level out to a thickness of the antiferromagnetic layer 24 of at least 800 angstroms.

The exchange bias characteristics, as shown in FIG. 5, are vastly superior to that produced by the prior art structures of FIGS. 1 and 2 as shown in FIG. 3. The independence of exchange bias with thickness of the antiferromagnetic layer, over a wide range of thickness, provides a very wide device processing window during manufacture of the MR sensors.

Figure 6:
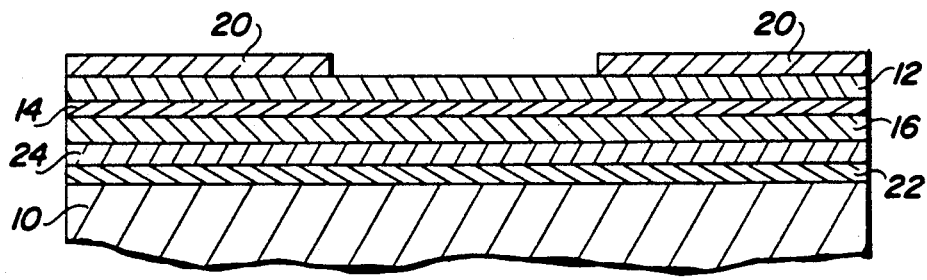
FIG. 6 is an end view of an alternate embodiment of an MR sensor according to the present invention.
Figure 7:
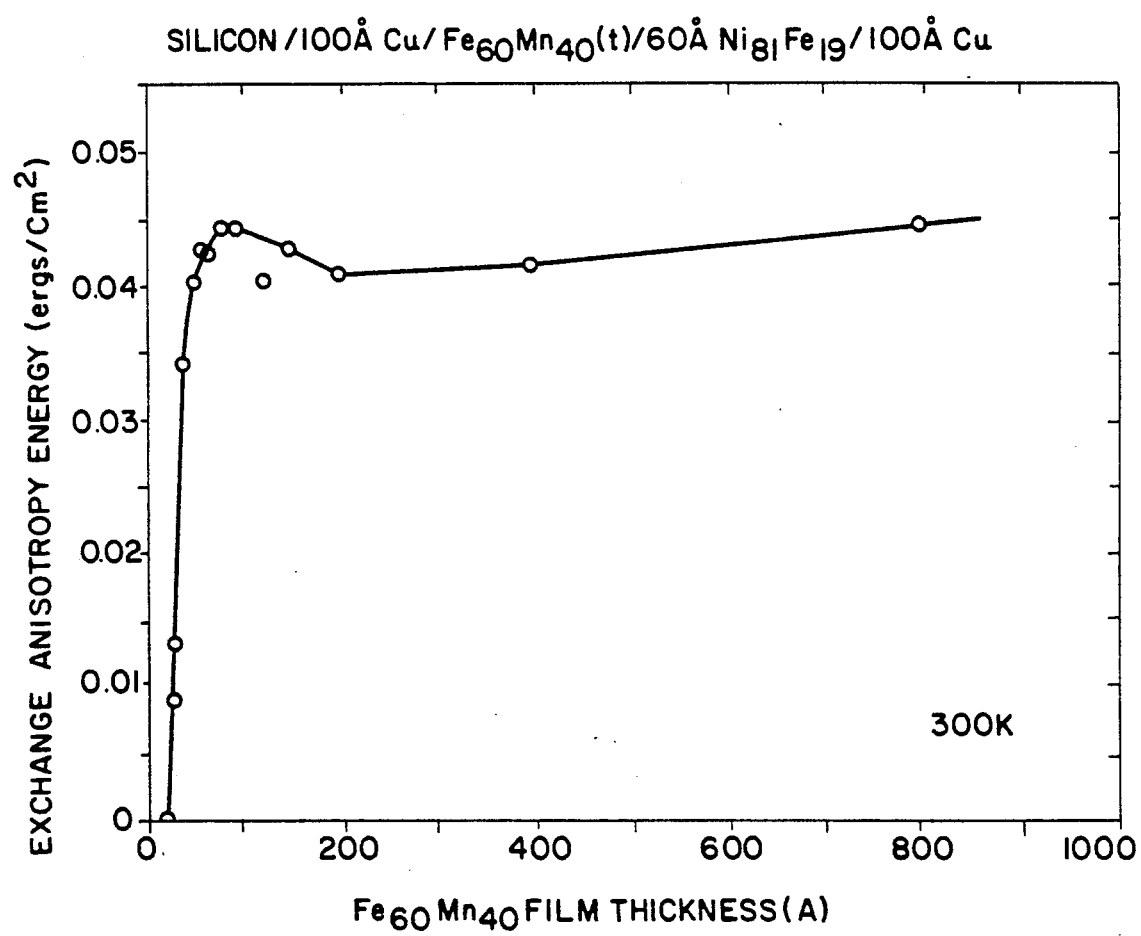
FIG. 7 is a graph of exchange anisotropy energy as a function of the thickness of the antiferromagnetic layer for the MR sensor of FIG. 6.

An alternate embodiment of the MR sensor, according to the present invention, is shown in FIG. 6. The MR sensor comprises an auxiliary layer 22 on a suitable substrate 10. Auxiliary layer 22 comprises a material having an FCC structure, and, in a specific embodiment, layer 22 is copper. The antiferromagnetic layer 24 is deposited on layer 22, and antiferromagnetic layer 24 comprises $Fe_{(1-x)}Mn_x$, where x is within the range of 0.3 to 0.4. MR layer 16 is then deposited in direct contact with antiferromagnetic layer 24 so that exchange bias is produced. Spacer layer 14 and transverse bias layer 12 are deposited after the MR layer 16. The resulting exchange bias for the embodiment shown in FIG. 6 is shown in FIG. 7 where the exchange bias increases rapidly until a high value is reached at a thickness of about 100 angstroms, and the exchange bias remains at the high level out to a thickness of the antiferromagnetic layer 24 of at least 800 angstroms.

The exchange bias characteristics of the FIG. 6 embodiment are vastly superior to that produced by the prior art structure of FIGS. 1 and 2 as shown in FIG. 3. The ability to produce different structures as shown in FIGS. 4 and 6 and still maintain independence of exchange bias over a wide range of thickness of the antiferromagnetic layer further enhances the manufacturing process for the MR sensor.

Figure 8:
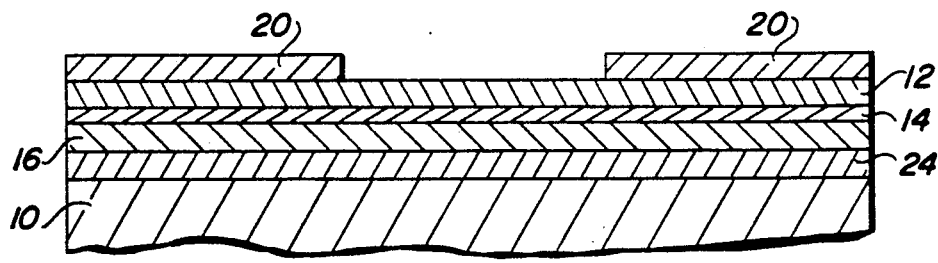
FIG. 8 is an end view of a further embodiment of an MR sensor according to the present invention.
Figure 9:
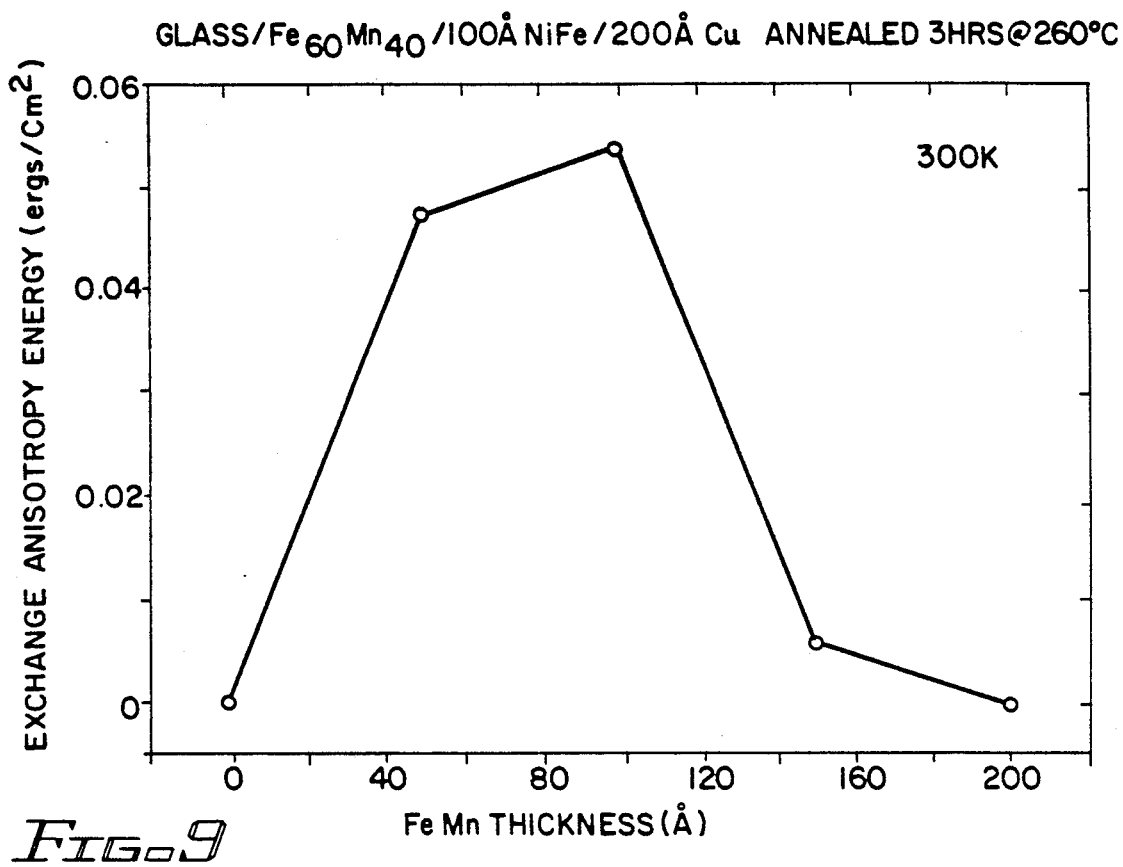
FIG. 9 is a graph of exchange anisotropy energy as a function of thickness of the antiferromagnetic layer for the MR sensor of FIG. 8.

A further embodiment of the invention is shown in FIG. 8. The MR sensor shown in FIG. 8 comprises an antiferromagnetic layer 24 deposited directly on substrate 10, and MR layer 16 is deposited in direct contact with antiferromagnetic layer 24. Antiferromagnetic layer 24 comprises $Fe_{(1-x)}Mn_x$, where x is within the range of 0.3 to 0.4. The '315 patent teaches that no exchange bias will be produced when the antiferromagnetic layer is not deposited onto a surface with FCC structure. However, in the embodiment of the present invention shown in FIG. 8, the antiferromagnetic layer 24 is deposited directly on substrate 10, which can be an amorphous material, and still produce exchange bias with MR layer 16 as is shown in FIG. 9. It can be seen that the level of exchange anisotropy energy and the associated exchange bias, and their variation with thickness is along the line of the prior art structures (FIGS. 1 and 2) shown in FIG. 3. The fact that exchange bias can be produced even when the antiferromagnetic layer is not deposited on an FCC structure provides another level of flexibility in the design of the MR sensor and a corresponding easing of the manufacturing process for the MR sensor.

Figure 10:
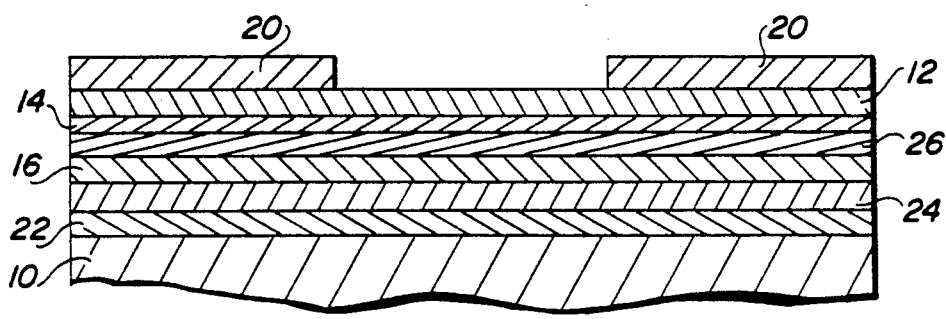
FIG. 10 is an end view of another embodiment of an MR sensor according to the present invention.

Another embodiment of an MR sensor according to the invention is shown in FIG. 10. In this embodiment an auxiliary layer 22, an antiferromagnetic layer 24 and an MR layer 16 are deposited as in FIG. 6 embodiment. However, a second antiferromagnetic layer 26 is deposited in direct contact with the MR layer 16, and this antiferromagnetic layer 22 also comprises $Fe_{(1-x)}Mn_x$, where x is within the range of 0.3 to 0.4. Note that there are now two exchange bias fields, one between antiferromagnetic layer 24 and ferromagnetic MR layer 16, and the second between antiferromagnetic layer 26 and ferromagnetic MR layer 16. With this embodiment, the exchange bias versus thickness curve is similar to that shown in FIG. 7, but with a substantially higher level of exchange bias. Alternatively, the auxiliary layer 22 can be omitted. In that case the exchange bias versus thickness curve is similar to that shown in FIG. 9, but with a substantially higher level of exchange bias.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new, and desire to secure by Letters Patent is:

1. An improved magnetoresistive sensor of the type having an antiferromagnetic layer in direct contact with a magnetoresistive ferromagnetic layer for inducing a longitudinal bias in the ferromagnetic layer, wherein the improvement is an antiferromagnetic layer comprising an alloy of manganese (Mn) and iron (Fe), $Fe_{(1-x)}Mn_x$, where x is within the range of 0.3 to 0.4.

2. The magnetoresistive sensor according to claim 1 wherein said ferromagnetic layer is an alloy comprising nickel and iron.

3. The magnetoresistive sensor according to claim 2 wherein ferromagnetic layer alloy comprises about 80 percent nickel and about 20% iron.

4. A magnetoresistive read sensor comprising:
a thin magnetoresistive layer of ferromagnetic material;
a thin layer of antiferromagnetic material in direct contact with said magnetoresistive layer for inducing a magnetic exchange bias in said magnetoresistive layer, said antiferromagnetic material being an alloy of manganese (Mn) and iron (Fe) $Fe_{(1-x)}Mn_x$, where x is within the range of 0.3 to 0.4; and
means for producing a transverse bias in said magnetoresistive layer whereby, upon connection of a sensing means to said magnetoresistive layer, resistance changes in said magnetoresistive layer can be determined as a function of the magnetic fields intercepted by said magnetoresistive layer.

5. The sensor according to claim 4 wherein said magnetoresistive layer is an alloy comprising nickel and iron.

6. The sensor according to claim 5 wherein said magnetoresistive layer alloy comprises about 80 percent nickel and about 20% iron.

7. A magnetoresistive read sensor comprising:
a thin layer of antiferromagnetic material comprising an alloy of Manganese (Mn) and iron (Fe), $Fe_{(1-x)}Mn_x$, where x is within the range of 0.3 to 0.4;
a thin magnetoresistive layer of ferromagnetic material in direct contact with said antiferromagnetic layer, said antiferromagnetic layer induces a magnetic exchange bias in said magnetoresistive layer; and
means for producing a transverse bias in said magnetoresistive layer whereby, upon connection of a sensing means to said magnetoresistive layer, resistance changes in said magnetoresistive layer can be determined as a function of the magnetic fields intercepted by said magnetoresistive layer.

8. The sensor according to claim 7 wherein said magnetoresistive layer is a magnetoresistive layer alloy comprising nickel and iron, 9. The sensor according to claim 8 wherein said magnetoresistive layer alloy comprises about 80 percent nickel and about 20% iron.

10. The sensor according to claim 7 additionally comprising an auxiliary layer prior to said layer of antiferromagnetic material, said auxiliary layer comprising a material having a face-centered cubic structure.

11. The sensor according to claim 10 wherein said auxiliary layer comprises copper.

12. The sensor according to claim 10 additionally comprising a second layer of antiferromagnetic material in direct contact with said layer of ferromagnetic material for inducing a further magnetic exchange bias in said magnetoresistive layer, said antiferromagnetic material comprising an alloy of manganese (Mn) and iron (Fe), $Fe_{(1-x)}Mn_x$, where x is within the range of 0.3 to 0.4.

13. The sensor according to claim 7 additionally comprising a second layer of antiferromagnetic material in direct contact with said layer of ferromagnetic material for inducing a further magnetic exchange bias in said magnetoresistive layer, said antiferromagnetic material comprising an alloy of manganese (Mn) and iron (Fe), $Fe_{(1-x)}Mn_x$, where x is within the range of 0.3 to 0.4.

14. A magnetoresistive read sensor comprising:
a substrate;
a thin layer of antiferromagnetic material upon said substrate, said thin film of antiferromagnetic comprising an alloy of Manganese (Mn) and iron (Fe), $Fe_{(1-x)}Mn_x$, where x is within the range of 0.3 to 0.4;
a thin magnetoresistive layer of ferromagnetic material in direct contact with said antiferromagnetic layer said antiferromagnetic layer induces a magnetic exchange bias in said magnetoresistive layer; and
means for producing a transverse bias in said magnetoresistive layer whereby, upon connection of a sensing means to said magnetoresistive layer, resistance changes in said magnetoresistive layer can be determined as a function of the magnetic fields intercepted by said magnetoresistive layer.

15. The sensor according to claim 14 wherein said substrate has a surface which does not comprise a face-centered cubic structure, said thin film of antiferromagnetic material being deposited upon said surface.

* * * * *